(12) United States Patent
Kang et al.

(10) Patent No.: US 12,670,965 B2
(45) Date of Patent: Jun. 30, 2026

(54) NON-LINEAR MEMORY FAILURE ANALYSIS METHOD AND MEMORY TEST APPARATUS

(71) Applicant: UIF (University Industry Foundation), Yonsei University, Seoul (KR)

(72) Inventors: Sungho Kang, Seoul (KR); Ha Young Lee, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 34 days.

(21) Appl. No.: 18/757,178

(22) Filed: Jun. 27, 2024

(65) Prior Publication Data

US 2025/0006286 A1     Jan. 2, 2025

(30) Foreign Application Priority Data

Jun. 28, 2023     (KR) ........................ 10-2023-0083483

(51) Int. Cl.
*G11C 29/10*     (2006.01)
*G11C 29/56*     (2006.01)
(52) U.S. Cl.
CPC .............. *G11C 29/10* (2013.01); *G11C 29/56* (2013.01)
(58) Field of Classification Search
CPC ............ G11C 29/10; G11C 2029/5604; G11C 2029/5606; G11C 29/56; G11C 29/56008; G11C 29/56004; G11C 29/56016
See application file for complete search history.

(56) References Cited

U.S. PATENT DOCUMENTS 6,442,724 B1 *  8/2002  Augarten ......... G11C 29/56008
                                                714/738
7,260,758 B1 *  8/2007  Agrawal ................ G11C 29/56
                                                714/733

(Continued)

FOREIGN PATENT DOCUMENTS

KR      1020010109342 A      12/2001
KR      1020100031148 A       3/2010

(Continued)

OTHER PUBLICATIONS

Hyungjun Cho et al., "A Very Efficient Redundancy Analysis Method Using Fault Grouping" ETRI Journal, vol. 35, No. 3, Jun. 2013.

(Continued)

*Primary Examiner* — Cynthia Britt
(74) *Attorney, Agent, or Firm* — Maschoff Brennan

(57)     ABSTRACT

The present embodiment relates to a memory failure analysis method that is performed by a memory test apparatus. The memory failure analysis method includes setting a test area of a memory under test (MUT), inputting a test pattern to the set test area, receiving a test result from the MUT, and an updating operation including operation (a) of storing failure information extracted from the test result and operation (b) of compressing, updating, and storing failure information, which is stored in a failure accumulator, using the stored failure information, wherein a first failure detector and a second failure detector alternately perform operation (a) and operation (b), and the test area is a non-linear area.

20 Claims, 3 Drawing Sheets

(56)             References Cited

U.S. PATENT DOCUMENTS

| | | | | |
|---|---|---|---|---|
| 9,032,244 | B2 | 5/2015 | Strauss | |
| 2005/0047229 | A1* | 3/2005 | Nadeau-Dostie | G11C 29/40 |
| | | | | 714/766 |
| 2005/0050410 | A1* | 3/2005 | Pomaranski | G11C 29/56 |
| | | | | 714/723 |
| 2006/0146622 | A1* | 7/2006 | Mukherjee | G11C 29/16 |
| | | | | 365/201 |
| 2006/0156134 | A1 | 7/2006 | Mukherjee et al. | |
| 2009/0327822 | A1* | 12/2009 | Kameda | G06F 11/1068 |
| | | | | 714/E11.02 |
| 2022/0059180 | A1* | 2/2022 | Perner | G11C 29/46 |

FOREIGN PATENT DOCUMENTS

| | | |
|---|---|---|
| KR | 10-2014-0000454 | 1/2014 |
| KR | 102135470 B1 | 7/2020 |

OTHER PUBLICATIONS

KR Office Action dated Sep. 9, 2024 in application 1020230083483.

* cited by examiner

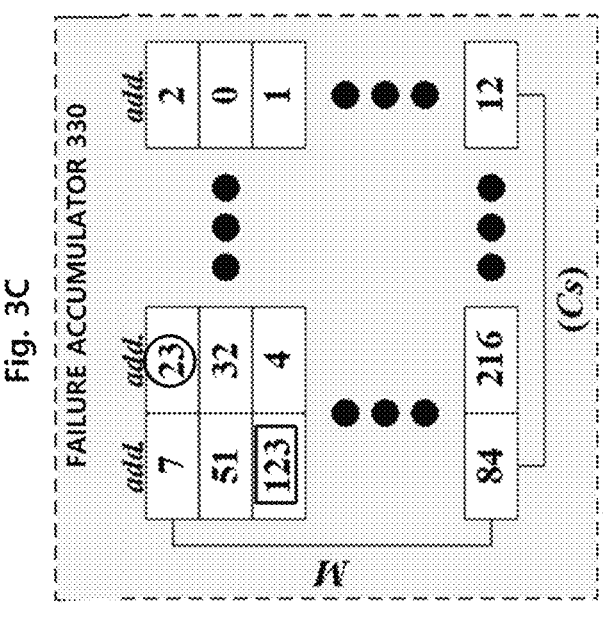
Fig. 3C
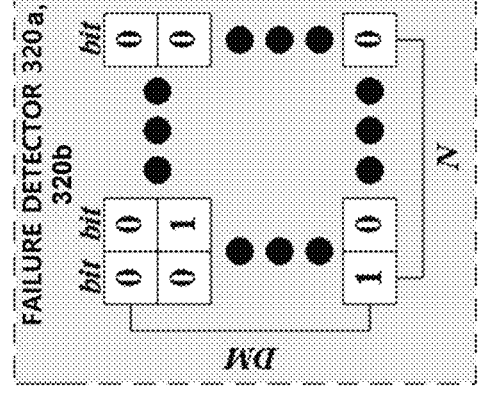
Fig. 3B
Fig. 3A

NON-LINEAR MEMORY FAILURE ANALYSIS METHOD AND MEMORY TEST APPARATUS

CROSS-REFERENCE TO RELATED APPLICATION

This application claims priority to and the benefit of Korean Patent Application No. 10-2023-0083483, filed on Jun. 28, 2023, the disclosure of which is incorporated herein by reference in its entirety.

BACKGROUND

1. Field of the Invention

The present disclosure generally relates to a non-linear memory failure analysis method and a memory test apparatus.

2. Discussion of Related Art

With the advancement of semiconductor manufacturing technologies, the data storage capacity and density of memories have abruptly increased, and at the same time, the probability of a failure occurring in memories has also considerably increased. For this reason, memory test and recovery are widely used to increase memory yield.

As the probability of a failure occurring in memories continues to increase and types of failures in memories become more diverse, a time required for a memory test is directly related to the total costs for memory test and repair and thus is one of important factors that determine productivity. Various memory test algorithms have been developed to reduce a memory test time and increase test coverage.

Meanwhile, a memory test generally uses a failure bitmap memory with the same memory capacity as a memory under test (MUT) included in automatic test equipment (ATE), and memory repair is generally performed by replacing defective cells using rows and/or column redundancies embedded in a memory.

SUMMARY OF THE INVENTION

Nowadays, as the capacity of a memory under test (MUT) increases, the size of a memory constituting a failure bitmap also increases, and a time for writing failure data on the failure bitmap and reading the failure data from the failure bitmap increases. Therefore, a time required for testing is continuously increasing. In addition, a redundancy analysis time for memory repair is also continuously increasing.

Furthermore, there is a case in which a failure at any one position of a memory affects other rows and/or columns, but such a failure is difficult to detect in the conventional linear manner.

The present embodiment is directed to solving the difficulties of the related art described above. The present embodiment is directed to providing a technology which is capable of reducing costs of test equipment by reducing a failure bitmap used in the related art and simultaneously detecting a failure of a memory by performing both linear and non-linear test algorithms.

According to an aspect of the present disclosure, there is provided a memory failure analysis method, which is performed by a memory test apparatus, the memory failure analysis method including setting a test area of an MUT, inputting a test pattern to the set test area, receiving a test result from the MUT, and an updating operation including operation (a) of storing failure information extracted from the test result and operation (b) of compressing, updating, and storing failure information, which is stored in a failure accumulator, using the stored failure information, wherein a first failure detector and a second failure detector alternately perform operation (a) and operation (b), and the test area is a non-linear area.

In the updating operation, operation (a) and operation (b) may be performed simultaneously.

After the updating operation, the test area may be set after moving a test area, and the inputting of the test pattern, the receiving of the test result, and the updating operation may be performed, wherein the test area set after moving the test area is any one of an area overlapping a previous test area and an area not overlapping the previous test area.

The first failure detector and the second failure detector may each include a failure bitmap memory corresponding to the test area.

Operation (a) may be performed for a preset number of test areas.

After storing of failure information of the preset number of test areas is completed, the first failure detector and the second failure detector may be alternately operated.

Operation (b) of compressing, updating, and storing the failure information stored in the failure accumulator may be performed by finding a failed row address and a failed column address in the failure information provided by any one of the first failure detector and the second failure detector, and writing the failed column address on a row corresponding to a failed row provided by the failure accumulator.

The failure accumulator may have rows corresponding to the number of rows of the MUT and columns corresponding to the number of column redundancies for repairing the MUT.

Operation (b) of compressing, updating, and storing the failure information stored in the failure accumulator may be performed by finding a failed row address and a failed column address in the failure information provided by any one of the first failure detector and the second failure detector, and writing a failed row address on a column corresponding to a failed column provided by the failure accumulator.

The failure accumulator may have columns corresponding to the number of columns of the MUT and rows corresponding to the number of row redundancies for repairing the MUT.

According to another aspect of the present disclosure, there is provided a memory test apparatus for performing a memory failure analysis method, the memory test apparatus including a controller, a window register configured to store information on a test area of an MUT set by the controller, a first failure detector and a second failure detector configured to provide a test result for the test area and store failure information extracted from the provided test result, and a failure accumulator in which the stored failure information is compressed, updated, and stored using the failure information stored in the first failure detector and the second failure detector, wherein the first failure detector and the second failure detector alternately perform a process of storing the failure information and a process of compressing, updating, and storing the failure information, and the test area is a non-linear area.

The process of storing the failure information and the process of compressing, updating, and storing the failure information may be performed simultaneously.

After the failure information of the failure accumulator is compressed, updated, and stored, information on a new test area set by the controller may be stored in the window register, and the new test area may be any one of an area overlapping a previous test area and an area not overlapping the previous test area.

The first failure detector and the second failure detector may each include a failure bitmap memory corresponding to the test area.

A process of providing the test result for the test area and storing the failure information extracted from the provided test result may be performed for a preset number of test areas.

After the storing of the failure information for the preset number of test areas is completed, the first failure detector and the second failure detector may be alternately operated.

The compressing, updating, and storing of the failure information stored in the failure accumulator may be performed by finding a failed row address and a failed column address in the failure information provided by any one of the first failure detector and the second failure detector, and writing the failed column address on a row corresponding to a failed row provided by the failure accumulator.

The failure accumulator may have has rows corresponding to the number of rows of the MUT and columns corresponding to the number of column redundancies for repairing the MUT.

The compressing, updating, and storing of the failure information stored in the failure accumulator may be performed by finding a failed row address and a failed column address in the failure information provided by any one of the first failure detector and the second failure detector, and writing the failed row address on a column corresponding to a failed column provided by the failure accumulator.

The failure accumulator may have columns corresponding to the number of columns of the MUT and rows corresponding to the number of row redundancies capable of repairing the MUT.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIG. 3A is a diagram illustrating an overview of a window register, FIG. 3B is a diagram illustrating an overview of a failure detector, and FIG. 3C is a diagram illustrating an overview of a failure accumulator.

DETAILED DESCRIPTION OF EXEMPLARY EMBODIMENTS

Figure 1:
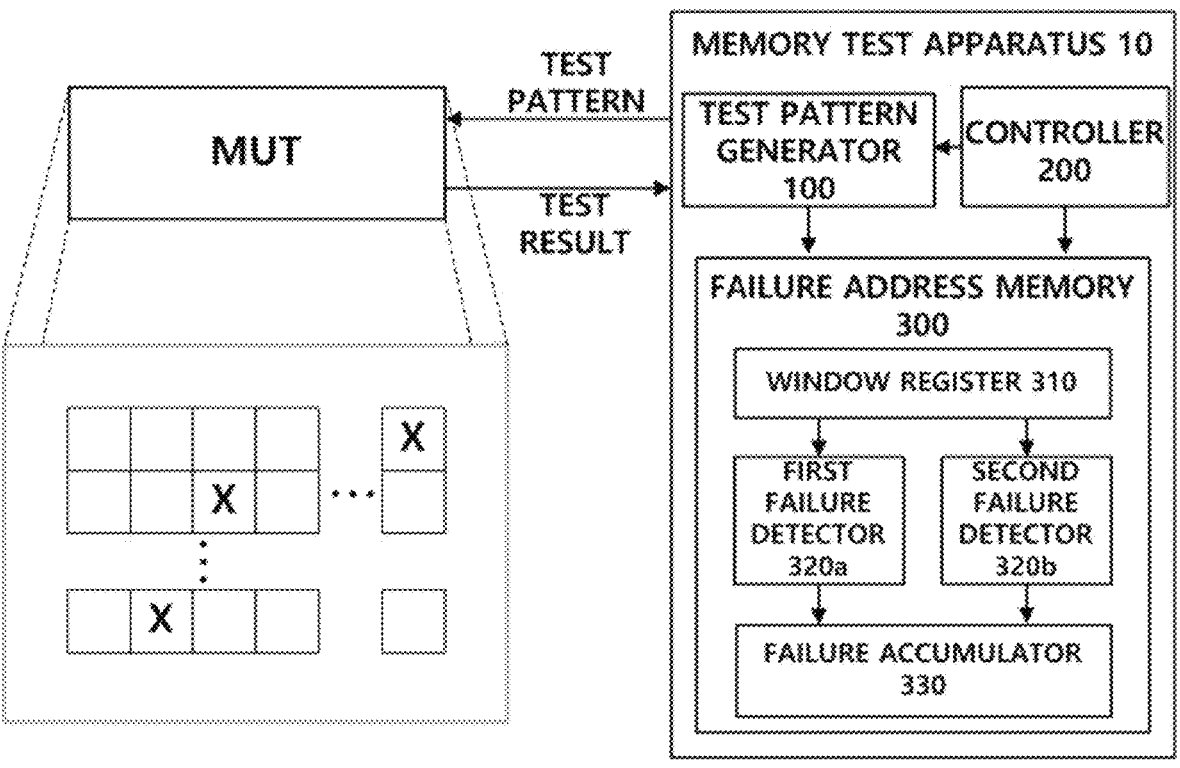
FIG. 1 is a diagram illustrating an overview of a memory test apparatus and a memory under test according to the present embodiment.

Hereinafter, the present embodiment will be described with reference to the accompanying drawings. FIG. 1 is a diagram illustrating an overview of a memory test apparatus 10 and a memory under test (MUT) according to the present embodiment. Referring to FIG. 1, the memory test apparatus 10 includes a controller 200, a window register 310 that stores a test area of the MUT set by the controller 200, a first failure detector 320a and a second failure detector 320b that store failure information extracted from a test result obtained by providing a test result for the test area, and a failure accumulator 330 in which stored failure information is compressed, updated, and stored using the failure information stored in the first failure detector 320a and the second failure detector 320b. The first failure detector 320a and the second failure detector 320b alternately perform a process of storing failure information and a process of compressing, updating, and storing the failure information.

In one embodiment, the controller 200 may be implemented with a general-purpose central processing unit (CPU), an application specific integrated circuit (ASIC) for a memory test apparatus, or the like and may control a test pattern generator 100, a failure address memory 300, and the like. As an example, the controller 200 may receive a test result output from the MUT and may provide the test result to the first failure detector 320a or the second failure detector 320b and store the test result. Alternatively, a failure address stored in the failure accumulator 330 may be updated with a failure address stored in the first failure detector 320a or the second failure detector 320b and compressed and stored. However, this is merely one embodiment, and at least one of the test pattern generator and the failure address memory may include a dedicated controller that controls operation. According to another embodiment, at least one of a failure address buffer, a failure memory buffer, and a failure address collector may include a dedicated controller that controls operation.

Figure 2:
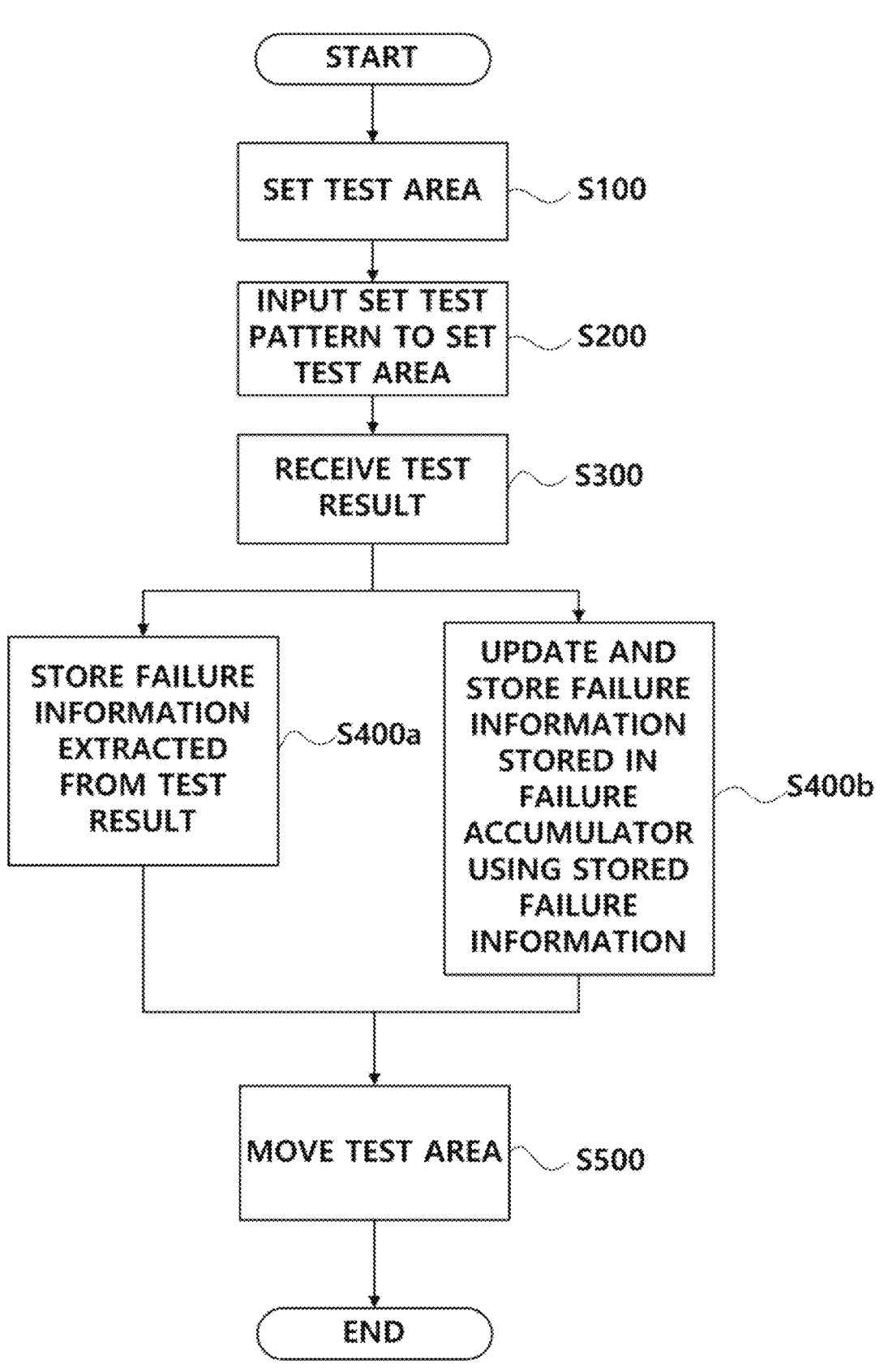
FIG. 2 is a flowchart illustrating an overview of a memory failure analysis method according to the present embodiment.

FIG. 2 is a flowchart illustrating an overview of a memory failure analysis method according to the present embodiment. Referring to FIGS. 1 and 2, the memory failure analysis method includes operation S100 of setting a test area of the MUT, operation S200 of inputting a test pattern to the set test area, operation S300 of receiving a test result from the MUT, and an updating operation including (a) operation S400a of storing failure information extracted from the test result, and (b) operation S400b of compressing and updating failure information, which is stored in the failure accumulator, using the stored failure information, wherein the first failure detector and the second failure detector alternately perform (a) operation S400a and (b) operation S400b. In one embodiment, the memory failure analysis method may be performed again after moving and setting the test area.

The test pattern generator 100 generates a test pattern designed to have high test coverage and provides the generated test pattern to the test area of the MUT. According to a related art, a test pattern was applied linearly along one line of rows or columns of an MUT, a test result was received from the line to which the test pattern was applied, and a failure was analyzed. However, according to the present embodiment, a test pattern is provided to a non-linear test area included in the MUT, and a test result is received from the test area, to which the test pattern is provided, to analyze a failure.

Hereinafter, the memory failure analysis method according to the present embodiment will be described with reference to FIGS. 1 to 3. FIG. 3A is a diagram illustrating an overview of the window register 310. Referring to FIG. 3A, the controller 200 sets a test area, which is to be tested, in the MUT, and stores the test area in the window register 310 (S100). In the shown embodiment, the test area is a square area in which a total of 64 rows from a $64^{th}$ row to a $127^{th}$ row and a total of 64 columns from a $32^{th}$ column to a $95^{th}$ column overlap each other. However, this is merely an embodiment, and a size of the test area may change depending on the memory capacity or the like of the MUT. In addition, as shown in the example, the numbers of rows and columns included in the test area are the same, and thus the test area may have a square shape. However, this is also merely an embodiment, and the numbers of rows and columns included in the test area are different, and thus the test area may have a rectangular shape.

The test pattern generator 100 provides the test pattern to the test area set in the window register 310 (S200). The controller 200 receives a test result, which is obtained by applying the test pattern, from the MUT (S300), extracts failure information from the test result, and stores the extracted failure information in the first failure detector 320a or the second failure detector 320b (S400a).

FIG. 3B is a diagram illustrating an overview of a failure detector 320. Referring to FIG. 3B, the first failure detector 320a and the second failure detector 320b have a memory size corresponding to the set test area. In the embodiment illustrated in FIG. 3A, the test area has a 64×64 array, and thus the number DM of rows and the number N of columns in each of the first failure detector 320a and the second failure detector 320b correspond to a 64×64 memory array.

In addition, the first failure detector 320a and the second failure detector 320b store detected failures using a failure bitmap method. Accordingly, a bit "1," which is a failure indication bit, may be written on areas of the first failure detector 320a and the second failure detector 320b corresponding to the test area of the MUT, thereby indicating that there is a failure in a corresponding address. However, this is merely an embodiment, and the failure indication bit may be a bit other than the bit "1."

When a failure address is stored in any one of the first failure detector 320a and the second failure detector 320b, the other of the first failure detector 320a and the second failure detector 320b updates, compresses, and stores failure information stored in the failure accumulator 330. FIG. 3C is a diagram illustrating an overview of the failure accumulator 330. Referring to FIG. 3C, the failure accumulator 330 may have rows M corresponding to the number of rows of the MUT and columns Cs corresponding to the number of column redundancies capable of repairing a failure of the MUT.

The controller 200 reads failure information stored in the failure detector 320. As an example, when the failure information stored in the failure detector 320 is row 0 and column 23, the controller 200 writes failure address 23 in row 0 and column 23 of the failure accumulator 330 as shown in a bold circle. Similarly, when the failure information stored in the failure detector 320 is row 2 and column 123, the controller 200 writes failure address 123 in row 2 and column 123 of the failure accumulator 330 as shown in a bold square.

There may be a case in which all failure addresses are recorded in one row of the failure accumulator 330, and the failure addresses should be recorded again in the corresponding row in excess of the number of column redundancies. The failure accumulator 330 may have rows corresponding to the number of rows of the MUT and columns corresponding to the number of column redundancies capable of repairing a failure of the MUT. Therefore, a failure of a corresponding row cannot be repaired using the column redundancy, and it is necessary to repair the corresponding row by replacing the corresponding row with a row redundancy. In this case, the controller 200 may indicate that the corresponding row is replaced with the row redundancy by filling the corresponding row with a specific bit.

The above example has been described with reference to an example in which the failure accumulator 330 has rows corresponding to the number of rows of the MUT and columns corresponding to the number of column redundancies capable of repairing a failure of the MUT. However, according to another example that is not shown, the failure accumulator may have columns corresponding to the number of columns of the MUT and rows corresponding to the number of row redundancy capable of repairing a failure of the MUT.

The first failure detector 320a and the second failure detector 320b may alternately perform operation S400a of storing the failure information and operation S400b of updating and storing the failure information stored in the failure accumulator using the stored failure information. That is, when failure information is stored in the first failure detector 320a, the failure information of the failure accumulator 330 may be updated with failure information stored in the second failure detector 320b at the same time. Similarly, when failure information is stored in the second failure detector 320b, the failure information of the failure accumulator 330 may be updated with failure information stored in the first failure detector 320a at the same time.

As described above, the failure information may be accumulated and stored in the failure accumulator 330. Conventionally, failures were accumulated and stored using a failure bit map method. In this case, there was a difficulty in that memory capacity required to form a failure bitmap was large, and a required time increased because all data in the large memory capacity should be read to repair a failure.

However, according to the present embodiment, failure information can be compressed and stored without the formation of a failure bitmap, thereby providing an advantage of reducing required memory capacity. Furthermore, the number of redundancies requested for each row or column can be readily and easily identified, thereby providing an advantage of shortening a time required for reading a memory.

When a process of, after applying a test pattern in a preset number of test areas, receiving a test result and recording failure information to a failure detector is completed, a corresponding failure detector accumulates, compresses, and stores the failure information in a failure accumulator. In addition, another failure detector records failure information generated by a controller receiving a test result of the test area.

After a test in one test area is completed, the controller 200 sets another test area, applies a test pattern to the set test area, and receives a test pattern formed by the applied test pattern. In one embodiment, a newly set test area may be formed to partially overlap a previous test area. In another embodiment, the newly set test area may be formed to not overlap the previous test area.

According to a conventional linear test, a test was performed along one row or one column of an MUT. In this case, it was difficult to detect the occurrence of closely related failures in one area. However, according to the present embodiment, provided is an advantage in that it is possible to easily identify a failure positioned nearby in relation to any one failure.

According to the present disclosure, there is provided an advantage in which a failure, which occurs when a failure at one position of a memory affects other rows and/or other columns, can be detected.

Although embodiments shown in the drawings are described as a reference for helping understanding of the present disclosure, the embodiments are for implementation and merely exemplary, and those skilled in the art will understand that various modifications and equivalents are possible therefrom. Accordingly, the true technical scope of the present disclosure should be defined by the appended claims.

The invention claimed is:

1. A memory failure analysis method, which is performed by a memory test apparatus, the memory failure analysis method comprising:

setting a test area of a memory under test (MUT);

inputting a test pattern to the set test area;

receiving a test result from the MUT; and an updating operation including operation a of storing failure information generated by comparing the test pattern and the test result, and operation b of compressing, updating, and storing failure information, which is stored in a failure accumulator, using the stored failure information, wherein a first failure detector and a second failure detector alternately perform operation a and operation b, each of the first failure detector and the second failure detector including a processor and a memory, and the test area is a non-linear area.

2. The memory failure analysis method of claim 1, wherein, in the updating operation, operation a and operation b are performed simultaneously.

3. The memory failure analysis method of claim 1, wherein, after the updating operation, the test area is set after moving a test area, and the inputting of the test pattern, the receiving of the test result, and the updating operation are performed, wherein the test area set after moving the test area is any one of an area overlapping a previous test area and an area not overlapping the previous test area.

4. The memory failure analysis method of claim 1, wherein the first failure detector and the second failure detector each include a failure bitmap memory corresponding to the test area.

5. The memory failure analysis method of claim 1, wherein operation a is performed for a preset number of test areas.

6. The memory failure analysis method of claim 5, wherein, after the storing of the failure information for the preset number of test areas is completed, the first failure detector and the second failure detector are alternately operated.

7. The memory failure analysis method of claim 1, wherein operation b is performed by finding a failed row address and a failed column address in the failure information provided by any one of the first failure detector and the second failure detector, and writing the failed column address on a row corresponding to a failed row provided by the failure accumulator.

8. The memory failure analysis method of claim 7, wherein the failure accumulator has rows corresponding to the number of rows of the MUT and columns corresponding to the number of column redundancies for repairing the MUT.

9. The memory failure analysis method of claim 1, wherein operation b is performed by finding a failed row address and a failed column address in the failure information provided by any one of the first failure detector and the second failure detector, and writing the failed row address on a column corresponding to a failed column provided by the failure accumulator.

10. The memory failure analysis method of claim 9, wherein the failure accumulator has columns corresponding to the number of columns of the MUT and rows corresponding to the number of row redundancies for repairing the MUT.

11. A memory test apparatus for performing a memory failure analysis method, the memory test apparatus comprising:

a controller;

a window register configured to store information on a test area of a memory under test (MUT) set by the controller;

a first failure detector and a second failure detector configured to provide a test result for the test area and store failure information generated by comparing the test pattern and the test result; and a failure accumulator in which the stored failure information is compressed, updated, and stored using the failure information stored in the first failure detector and the second failure detector, wherein the first failure detector and the second failure detector alternately perform a process of storing the failure information and a process of compressing, updating, and storing the failure information, each of the first failure detector and the second failure detector including a processor and a memory.

12. The memory test apparatus of claim 11, wherein the process of storing the failure information and the process of compressing, updating, and storing the failure information are performed simultaneously.

13. The memory test apparatus of claim 11, wherein, after the failure information of the failure accumulator is compressed, updated, and stored, information on a new test area set by the controller is stored in the window register, and the new test area is any one of an area overlapping a previous test area and an area not overlapping the previous test area.

14. The memory test apparatus of claim 11, wherein the first failure detector and the second failure detector each include a failure bitmap memory corresponding to the test area.

15. The memory test apparatus of claim 11, wherein a process of providing the test result for the test area and storing the failure information extracted from the provided test result is performed for a preset number of test areas.

16. The memory test apparatus of claim 15, wherein, after the storing of the failure information for the preset number of test areas is completed, the first failure detector and the second failure detector are alternately operated.

17. The memory test apparatus of claim 11, wherein the compressing, updating, and storing of the failure information stored in the failure accumulator is performed by finding a failed row address and a failed column address in the failure information provided by any one of the first failure detector and the second failure detector, and writing the failed column address on a row corresponding to a failed row provided by the failure accumulator.

18. The memory test apparatus of claim 17, wherein the failure accumulator has rows corresponding to the number of rows of the MUT and columns corresponding to the number of column redundancies for repairing the MUT.

19. The memory test apparatus of claim 11, wherein the compressing, updating, and storing of the failure information stored in the failure accumulator is performed by finding a failed row address and a failed column address in the failure information provided by any one of the first failure detector and the second failure detector, and writing the failed row address on a column corresponding to a failed column provided by the failure accumulator.

20. The memory test apparatus of claim 19, wherein the failure accumulator has columns corresponding to the number of columns of the MUT and rows corresponding to the number of row redundancies capable of repairing the MUT.

* * * * *